United States Patent [19]

Hagiwara

[11] Patent Number: 5,332,869
[45] Date of Patent: Jul. 26, 1994

[54] PRINTED CIRCUIT BOARD, A METHOD OF ITS FABRICATION AND A METHOD OF ATTACHING ELECTRONIC PARTS THERETO

[75] Inventor: Youshichi Hagiwara, Kanagawa, Japan

[73] Assignee: W. R. Grace & Co.-Conn., New York, N.Y.

[21] Appl. No.: 600,042

[22] Filed: Oct. 17, 1990

[30] Foreign Application Priority Data

Oct. 27, 1989 [JP] Japan .................................. 1-281595

[51] Int. Cl.⁵ .............................................. H05K 1/09
[52] U.S. Cl. ................................. 174/257; 361/751; 29/831; 174/259; 174/256; 156/901
[58] Field of Search .............. 174/257, 258, 259, 260, 174/256, 88 R; 29/831; 156/273.9, 273.5, 311, 901; 361/409, 411; 427/53.1; 428/901

[56] References Cited

U.S. PATENT DOCUMENTS

| | | | |
|---|---|---|---|
| 4,113,981 | 9/1978 | Fujita et al. .................. | 174/88 R X |
| 4,157,932 | 6/1979 | Hirata ............................ | 156/901 X |
| 4,522,888 | 6/1985 | Eichelberger et al. ......... | 428/901 X |
| 4,744,850 | 5/1988 | Imano ........................... | 361/409 X |
| 4,868,637 | 9/1989 | Clements et al. ............. | 174/88 R X |
| 4,940,623 | 7/1990 | Bosna et al. .................. | 427/53.1 X |
| 5,019,944 | 5/1991 | Ishii et al. ..................... | 174/259 X |

*Primary Examiner*—Leo P. Picard
*Assistant Examiner*—L. Thomas
*Attorney, Agent, or Firm*—Valerie E. Looper

[57] ABSTRACT

A new circuit board and process for making the board are disclosed. The process comprises (a) forming a circuit pattern and terminal pads (on a substrate) with electrically conductive composition comprising conductive powder and a light curable resin binder; (b) shielding the terminal pads; (c) curing the circuit pattern by exposing it to light; and (d) applying conductive particles to the unexposed terminal pads and adhering the particles thereto by exposing the terminal pad to light; and then (e) coating the terminal pads with an insulating adhesive. A new method for attaching other circuit boards or electronic parts is also disclosed. The method comprises first aligning a circuit board or electronic part with the coated terminal pad of the new circuit board. Secondly, heat is applied to the terminal pad to cure the terminal pads, and thus bond the board or part to that terminal pad.

10 Claims, 2 Drawing Sheets

PRINTED CIRCUIT BOARD, A METHOD OF ITS FABRICATION AND A METHOD OF ATTACHING ELECTRONIC PARTS THERETO

BACKGROUND

This invention relates to printed circuit boards and methods of fabricating such boards. In particular, the invention relates to a printed circuit board on which electronic parts can be attached without using soldering techniques or anisotropic electrically conductive adhesive techniques. The invention also relates to methods of attaching electronic parts, or other circuit boards, to a circuit board.

In the past, circuit patterns on circuit board substrates were mainly made from copper and in order to connect electronic parts to copper patterns, the parts were soldered directly onto the pattern. The patterns were usually prepared by etching and removing copper foil which was laminated onto the substrate. More recently, and alternatively, the circuit pattern can be formed by printing a conductive paste containing electrically conductive particles such as silver, platinum or palladium and glass frit, followed by sintering.

However, both methods entail problems. The former method of preparation involves the complicated process of etching. It also incurs waste of material because a major part of the copper foil is removed and discarded. The latter method requires baking at high temperatures in the range of 600°–900° C., and requires the use of expensive and easily damaged ceramics as the substrate. In addition, the latter method requires baking equipment which is large and highly bulky.

As a result, attempts have been made to acquire an electrically conductive composition which leads to a simpler process for making solderable circuits and which uses inexpensive material. One attempt involves using conductive paste compositions which employ a synthetic resin binder that can be cured at a relatively low temperature. Such electrically conductive paste is formed, for example, by dispersing silver powder in epoxy resin or by dispersing copper powder in phenolic resin. The paste is then printed onto a synthetic resin laminated board or film and baked to form the cured circuit pattern.

Another attempt involves a method which does not require a soldering process to connect electronic parts or other circuit boards to the circuitry. Such a method involves using anisotropic electrically conductive adhesives. See U.S. Pat. No. 4,133,981 to Fujita et al. Those adhesives are prepared by dispersing electrically conductive metallic particles or powder in a binder resin composition. The binder resin and dispersed particles are then prepared in film form and adhered on one of the two sets of terminals to be connected. The two sets of terminals are then adhered together by heating the terminals with a heat press. However, this method, as well as the conductive paste method, have the following problems.

When using electrically conductive paste compositions, the bonding strength between the resin paste and the solder can be low. When using high amounts of resin binder the likelihood of a sufficient amount of conductive particles being exposed is reduced. Thus, contact with the solder is reduced. Further, while it is possible to increase the bonding strength with the solder by increasing the amount of the electrically conductive particles, such practice uses a smaller amount of resin and thus creates a new problem of reducing the adhesion strength between the insulating substrate and the conductive circuits. In addition, solders which have extremely low melting points possess poor solderability and are useless when using such methods because there is little bonding strength between the conductive paste and such solders. When silver powder is used as the electrically conductive particles in such pastes, a problem called "silver biting" occurs when the silver powder diffuses into the solder. This problem leads to reduced or lost conductivity between the part being attached by the solder and the circuit traces or pads. When copper powder is used as the electrically conductive particles, the surface of the copper powder may oxidize and a stable solder is thus difficult to obtain.

As mentioned above, methods using anisotropic electrically conductive adhesives also incur difficulties. For instance, it is difficult to avoid aggregation of the electrically conductive particles when fabricating the adhesives. It is also extremely difficult to prevent re-aggregation of the particles during the bonding process used to connect the opposing sets of terminals. As a result of this aggregation problem, particularly when the circuit is extremely fine, it is difficult to totally eliminate short circuiting with the neighboring terminals. Therefore a thorough inspection for and repair of any defects in the products is sometimes necessary after the connection step. Further, the anisotropic adhesive requires additional steps. For instance, if there are many parts which require bonding onto the circuit board, it is necessary to transfer the anisotropic electrically conductive adhesive from a carrier film to each area to which a part will be attached. It is also necessary that the adhesive film be shaped to match the shape of the area to which the part will be attached. This step not only requires more time and work, but is difficult to automate. Even moreover, the anisotropic electrically conductive adhesives tend to be opaque due to the presence of the conductive particles. That opacity causes a difficult problem with the precise alignment of the positions in the heat press/bonding process of the parts, particularly when the circuit is extremely fine in pitch.

SUMMARY OF THE INVENTION

It is, therefore a goal of this invention to eliminate the flaws of the above-mentioned technology and provide a novel circuit board comprising an electrically conductive circuitry on a substrate and wherein the circuitry comprises terminal pads formed on the substrate, wherein the terminal pads are covered by electrically conductive particles or powder and by an insulating adhesive wherein the adhesive covers at least the electrically conductive particles or powder and the terminal pads.

It is also an object to provide a printed circuit board which can be interconnected without the need for soldering or using anisotropic electrically conductive adhesives.

It is a further goal to provide a novel method of fabricating such printed circuit board, the method comprising
(a) forming a circuit pattern with an electrically conductive substance on a substrate wherein the circuit pattern has terminal pads,
(b) shielding the terminal pads in said circuit pattern and exposing the unshielded portion of the circuit pattern to light, (c) adhering electrically conductive particles or powder onto the unexposed terminal pads,
(d) covering at least the terminal pads, and the electrically conductive particles or powder adhered thereon, with an insulating adhesive, and
(e) curing the uncured terminal pads after either step (c) or (d).

Another goal of this invention is to provide a novel method of interconnecting electronic parts and other circuit boards to a printed circuit board. The method comprises the process described above for making circuit boards and then aligning the positions of the terminal pads covered by the insulating adhesive so that the terminal parts are aligned with the terminals pads of the electronic parts or the terminal pads of the other circuit board; heating either the rear side of the circuit pattern's terminal pads or the rear side of the terminal pads of the electronic part or other circuit board; and pressing to bond both terminal pads by means of said insulating adhesive.

DESCRIPTION OF THE PREFERRED EMBODIMENTS

Figure 1:
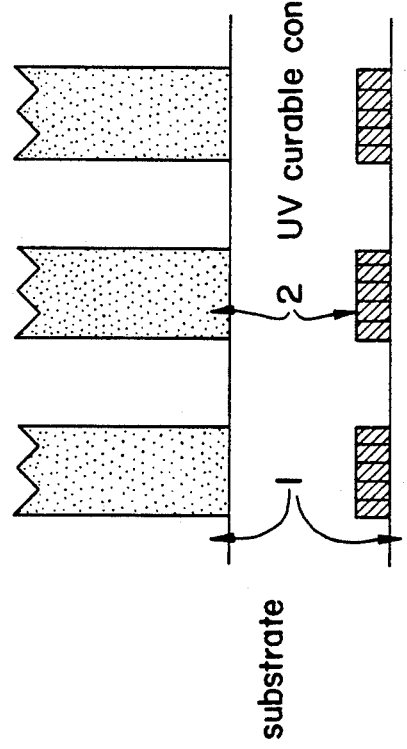
FIGS. 1 to 7: the upper figure is a top view and the lower figure is a cross-sectional view.
Figure 2:
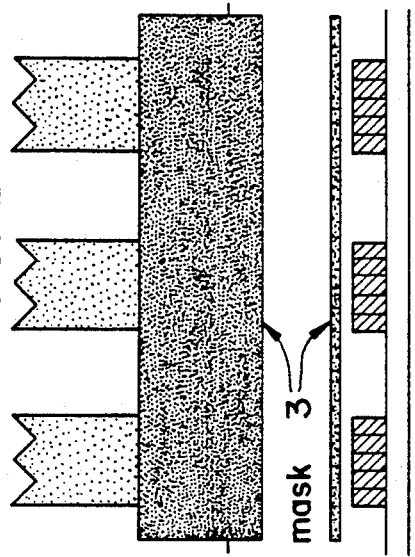
Figure 3:
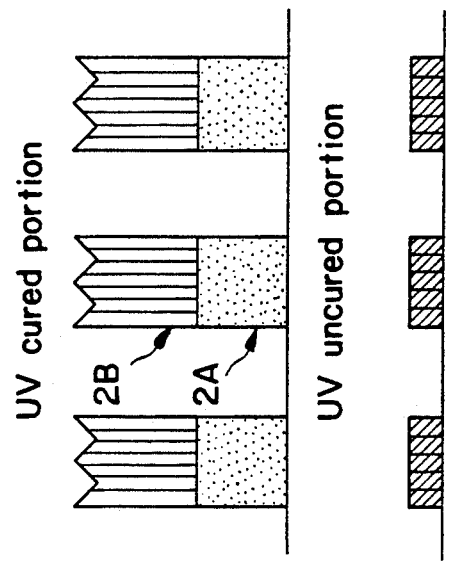
Figure 4:
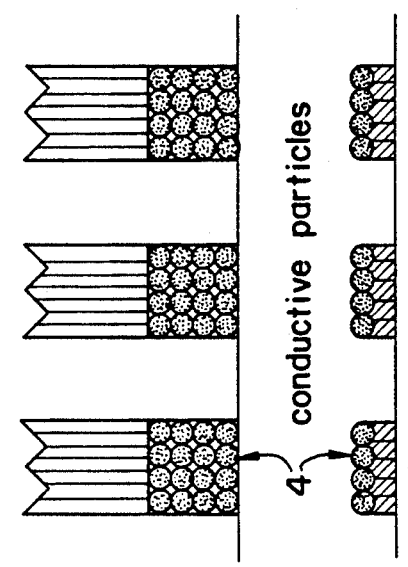
Figure 5:
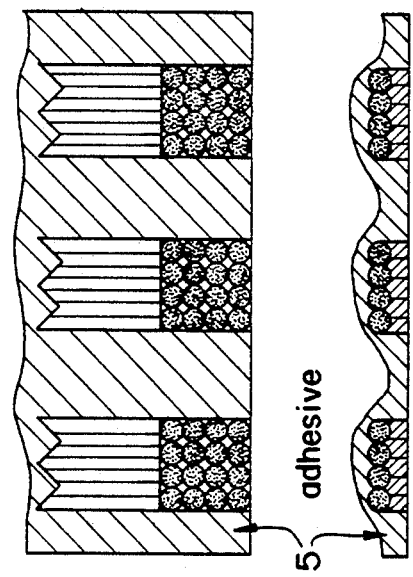
Figure 6:
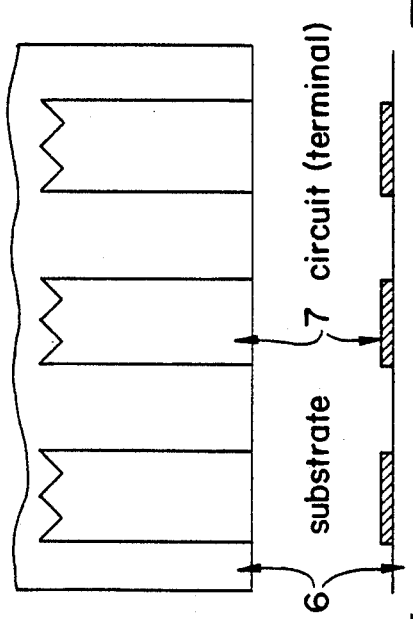
Figure 7:
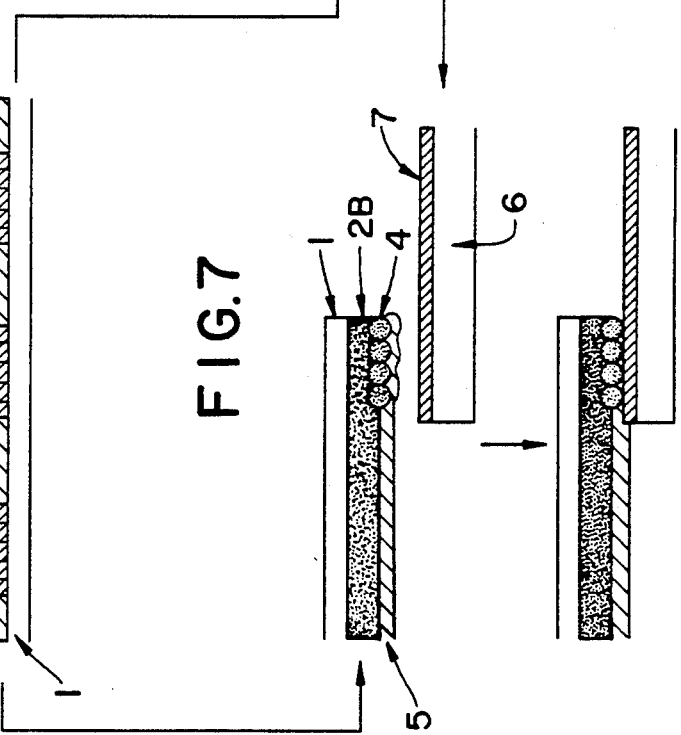
Figure 8:
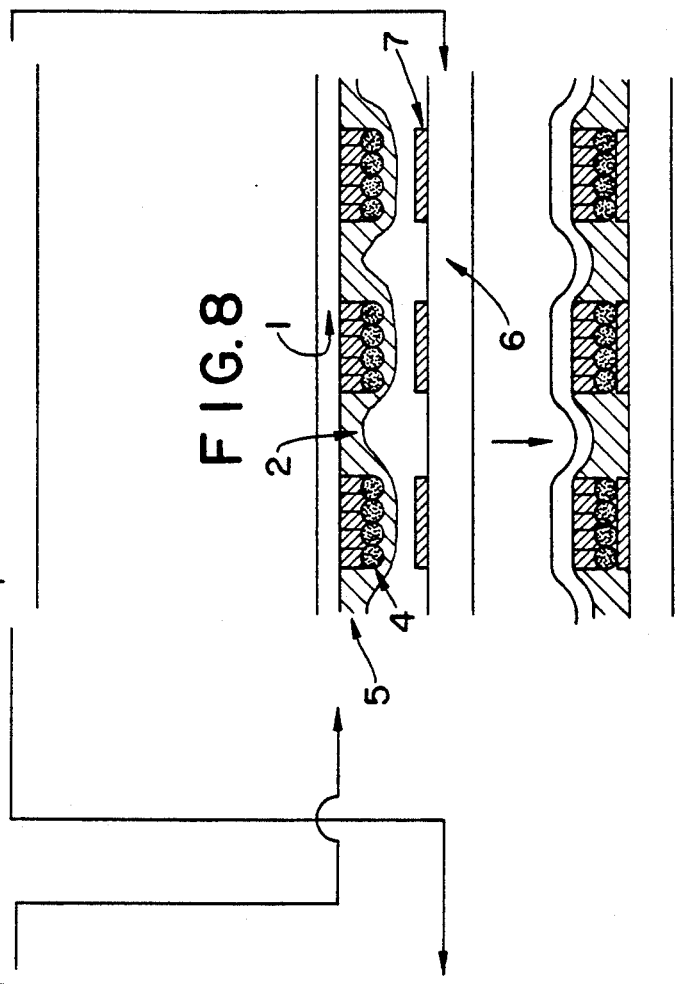
FIG. 8 is another cross-sectional view of FIG. 7.
Numerals in the Figures are defined as follows:
1, 6: substrate
2: UV curable conductive paste
2A: UV uncured portion
2B: UV cured portion
3: mask
4: conductive particles
5: adhesive
7: circuit (terminal).

The printed circuit board described herein, like those boards available in the past, has a printed circuitry formed by printing an electrically conductive substance onto the substrate. Generally, the circuitry is formed by a network of terminal pads and traces which are interconnected, as required. The terminal pads are formed for the purpose of connecting the circuit to electronic parts or other circuit boards while the interconnecting traces connect those parts or boards to other terminal pads which might also have a part or board attached thereto.

The configuration of the circuit board disclosed herein is also such that additional electrically conductive particles or powder can be adhered to the terminal pads and is such that an insulating adhesive can be subsequently coated or printed on at least the electrically conductive particles or powder and the terminal pads. Optionally, the entire surface of the circuit pattern can be coated with the insulating adhesive.

As mentioned above, the printed circuit boards can be fabricated by the following steps:
(a) forming a circuit pattern with terminal pads on a substrate by using an electrically conductive composition containing electrically conductive powder and light-curable resin material,
(b) exposing the circuitry to light after shielding the terminal pads of the circuit pattern,
(c) adhering electrically conductive particles or powder on the unexposed terminal pads,
(d) covering at least the terminal pads, which are covered by the electrically conductive particles or powder, with an insulating adhesive, and
(e) curing the uncured terminal pads with light and/or heat after either step (c) or (d).

Ultraviolet (UV)-curable compositions are suitable for the light-curable resin used for formation of the electrically conductive composition in step (a). The conductive powder can be any monolithic electrically conductive metal. Specific metals are listed later below. The electrically conductive composition is preferably screen printed onto a substrate to form a circuit pattern having traces and terminal pads suitable for receiving electronic parts or other circuit boards.

Materials which are suitable for the circuit board substrate include, but are not limited to, polyesters, polyimides, and epoxies (FR-4).

In step (b) the printed circuitry is preferably cured by exposure to UV light having a wavelength in the range of 200–600. Suitable sources of light include carbon arcs, mercury vapor arcs, fluorescent lamps with phosphorus emitting ultraviolet light, argon and xenon glow lamps, tungsten lamps and photographic flood lamps. The time required for exposure will depend upon a variety of factors which include the light curable resin used, the type of light source, and the distance between the light source and curable composition. Given these parameters, one familiar in the art would be able to select the appropriate exposure time.

As mentioned above, the terminal pads of the circuit pattern will be shielded from exposure to light during step (b). To shield the pads, any material which blocks light in the wavelength range described above is suitable. Aluminum sheets were used in the example illustrated below, but other shields can be used as well.

In step (c), any monolithic electrically conductive metal such as Ni, Fe, Cr, Al, Sb, Mo, Cu, Ag, Pt or Au, alloys or oxides of these monolithic metals, composites of two or more types of these monolithic metals can be used as the electrically conductive particles or powder. Electrically non-conductive materials such as glass or plastics plated with the aforementioned metals can also be used. The particles are preferably applied to terminal pads on the circuit pattern by spraying.

Thermoplastic resins and heat-curable resins can be used as the insulating adhesive used in step (d), provided such resin material exhibits adhesive properties when heated. Examples of such thermoplastic resins include, but are not limited to, polyester polymers, acrylic copolymers, styrene/butadiene copolymers, hydrogenated products of these copolymers, polyvinyl formal and polyamide resins and the like. Those resins can be used alone or in a mixture of two or more of those resins. A commercially available polyester resin is Vilon 30SS from Toyo Boseki K.K.

Plasticizers, crosslinking agents, anti-aging agents, and antioxidants may be added as well. Tackifying agents including rosin resins such as rosin, hydrogenated rosin, ester gum and maleic acid-modified rosin and the like; petroleum resins; xylene resins; and coumarone/indene resins and the like may also be added. Other examples of heat-curable resins include epoxy resins and phenolic resins. These heat-curable resins can also be used alone, or by mixing with the thermoplastic resins.

As discussed above, the insulating adhesive is either coated or printed on the whole surface of the circuit pattern, or at least on the terminal pads where the electrically conductive particles or powder are attached. However, a method may be adopted whereby such insulating adhesive is formed separately on a supporting substrate and then is laminated onto the surface of the circuit.

The uncured terminal pads are then preferably cured by heat or light.

The above-described printed circuit board allows one to use the following method of interconnecting the circuit board to electronic parts or another printed circuit. First, as discussed above, a printed circuit board is fabricated by (a)–(d) described at the beginning of this description. Next, the terminal pads of the resulting printed circuit board are aligned positionwise so that the surface of the insulating adhesive contacts the terminal of the electronic part or board to be connected. Subsequently, a heated metal head or the like is pressed on the rear side of one of the terminal pads to press-bond the two surfaces by heating the insulating adhesive. By this procedure, the electrically conductive particles or powder which are adhered and immobilized on the terminal pads of the printed circuit board pierce through the insulating adhesive to form an electrical connection with the terminals of the electronic parts. An adhesive bond is also formed.

As a result of using the circuit board fabrication method described above, the electrically conductive particles or powder are adhered and immobilized selectively only on the terminal pads of the circuit pattern. Thus, the electronic parts or boards to be connected can only be electronically interconnected at the terminal pads of the circuit pattern and no interconnection will exist in the regions other than the terminal pads. Further, when the whole surface of the printed circuit board is covered with insulating adhesive, the printed circuit board has a significant advantage in that it does not require the additional treatment of the circuitry for moisture proofing, insulation, etc.

Other advantages of this invention are listed below.
(a) Electronic parts can be mounted on the printed circuit by a simple heat press technique and avoids using solder or anisotropic electrically conductive adhesives.
(b) There is no risk of short circuiting the adjacent terminals of the printed circuit board.
(c) Positions can be aligned more easily and the process of mounting or interconnection can be simplified when compared to the alignment steps required when using anisotropic electrically conductive adhesives.

An example of this invention is provided below. It is provided to illustrate the invention but is not intended in any manner to define or limit the scope of the invention or the claims which follow.

EXAMPLE

An acrylate-based solventless silver filled UV-curable electrically conductive composition was used to form a circuit pattern of linear circuit traces. The thickness of the traces were 10 microns, the widths were 0.2 mm, the distances between the traces were 0.2 mm, the lengths of the traces were 5 cm, the width of the board was 3 cm, and the number of traces on the board was 75. A polyester film having a thickness of 25 microns was used as the board's substrate. The circuitry was formed on the substrate by a screen printing technique. Prior to exposure, terminal portions of the circuitry traces measuring 5 mm at both ends of the formed circuitry was shielded with aluminum foil. The circuit board was then exposed for 30 seconds to Oak Co.'s Jet Printer Model J-2000. After removing the aluminum foil, Bellpearl N-800 nickel-plated polymer particles from Kanebo K.K., were sprayed on the surface of the printed circuit and the unexposed terminal portions. Excess particles were shaken off the board by vibration. The board was then exposed to UV on both sides of the terminal portions where particles were attached.

A 20 micron film of "Vilon 30SS" polyester resin from Toyo Boseki K.K. prepared separately and laminated under heat onto the whole surface of the thus-acquired printed circuit, to obtain a printed circuit board. The circuit board was then tested for electrical conductivity as illustrated by the test described below.

One of the terminal portions on the circuitry obtained above was aligned with clear electrically conductive terminals which were formed onto a glass plate. Another terminal portion was then aligned with a copper circuit terminal (gold-plated) having the same pitch as the conductive material in the circuitry. The respective terminal portions were then heat-pressed at 150° C. for 15 seconds using a bonder.

The resistance of individual terminals of the circuitry and the copper circuit and the transparent electrically conductive circuit respectively was each less than 30 ohms, and were each considered very stable.

What is claimed is:
1. A method of fabricating printed circuit boards, the method comprising
   (a) forming a circuit pattern with an electrically conductive composition on a substrate wherein the circuit pattern has terminal pads, and wherein the circuit pattern comprises an electrically conductive composition containing light-curable resin and electrically conductive particles or powder,
   (b) shielding the terminal pads in said circuit pattern and exposing the unshielded portion of the circuit pattern to light,
   (c) scattering electrically conductive particles or powder onto the circuit pattern whereby the particles or powder are selectively adhered to the uncured terminal pads,
   (d) removing conductive particles which are not adhered to the uncured terminal pads,
   (e) covering at least said terminal pads, and electrically conductive particles or powder adhered thereon, with an insulating adhesive, and
   (f) curing the uncured terminal pads with light and/or heat after either Step (c) or (d) or (e).

2. A method according to claim 1, wherein said electrically conductive particles or powder is a member of the group consisting of a monolithic electrically conductive material, mixture of different monolithic electrically conductive metals and electrically non-conductive material plated to create electrical conductivity.

3. A method according to claim 1, wherein said insulating adhesive is a thermoplastic resin or heat-curable resin.

4. A method according to claim 1 wherein said insulating adhesive is a thermoplastic resin or heat-curable resin.

5. A method according to claim 3 wherein said insulating adhesive comprises polyester.

6. A method of connecting a printed circuit board to electronic parts or other circuit boards with terminal pads, the method comprising (a) forming a circuit pattern with an electrically conductive composition on a substrate wherein said pattern has terminal pads, and wherein the circuit pattern comprises an electrically conductive composition containing light-curable resin and electrically conductive particles or powder, (b) shielding the terminal pads in said circuit pattern and exposing the remainder of the pattern to light, thereby curing the remainder of the pattern, (c) scattering electrically conductive particles or powder onto the circuit pattern whereby the particles or powder are selectively adhered to the uncured terminal pads, (d) removing conductive particles which are not adhered to the uncured terminal pads, (e) covering at least said terminal pads, and electrically conductive particles or powder adhered thereon, with an insulating adhesive, (f) aligning the positions of the terminal pads covered by said insulated adhesive so that said terminal pads are aligned with the terminal pads of the electronic parts or other circuit boards, and (g) heating from a side of either the terminal pads of said circuit pattern or the terminal pads of said electronic parts or other circuit board and bonding both terminal pads by means of said insulating adhesive.

7. A method according to claim 6, wherein said electrically conductive particles or powder is a member of the group consisting of a monolithic electrically conductive material, mixture of different monolithic electrically conductive metals and electrically non-conductive material plated to create electrical conductivity.

8. A method according to claim 6, wherein said insulating adhesive is a thermoplastic resin or heat-curable resin.

9. A method according to claim 8 wherein said insulating adhesive comprises polyester.

10. A method according to claim 6 wherein in step (f) said heating is applied by a heat press.

* * * * *